United States Patent [19]

Nakayama et al.

[11] Patent Number: 5,559,400
[45] Date of Patent: Sep. 24, 1996

[54] VARIABLE WAVELENGTH LUMINESCENT DEVICE AND CONTROL METHOD THEREFOR

[75] Inventors: Takahiro Nakayama, Hitachi; Atsushi Kakuta, Hitachiota, both of Japan

[73] Assignee: Hitachi, Ltd., Tokyo, Japan

[21] Appl. No.: 338,151

[22] Filed: Nov. 9, 1994

[30] Foreign Application Priority Data

Nov. 15, 1993 [JP] Japan ................. 5-284758

[51] Int. Cl.$^6$ ................................................ H01J 1/70
[52] U.S. Cl. ........................ 313/506; 372/7; 372/99
[58] Field of Search ............................. 313/498, 499, 313/500, 501, 503, 504; 372/7, 99, 42

[56] References Cited

U.S. PATENT DOCUMENTS

| | | | |
|---|---|---|---|
| 4,394,069 | 7/1983 | Kaye | 359/53 |
| 4,435,047 | 3/1984 | Fergason | 350/334 |
| 4,945,009 | 7/1990 | Taguchi et al. | 428/690 |
| 5,003,221 | 3/1991 | Shimizu | 313/509 |
| 5,043,715 | 8/1991 | Kun et al. | 345/76 |
| 5,331,182 | 7/1994 | Takimoto et al. | 257/40 |
| 5,384,469 | 1/1995 | Choi | 257/21 |
| 5,405,709 | 4/1995 | Littman et al. | 428/690 |
| 5,405,710 | 4/1995 | Dodabalapur et al. | 428/690 |
| 5,444,270 | 8/1995 | Cunningham et al. | 257/98 |

FOREIGN PATENT DOCUMENTS

| | | | |
|---|---|---|---|
| 0616488A2 | 9/1994 | European Pat. Off. | H05B 33/12 |
| 4310082A1 | 9/1994 | Germany | H05B 33/14 |
| 3-197923 | 8/1991 | Japan | G02F 1/33 |

OTHER PUBLICATIONS

Japanese Journal of Applied Physics, vol. 27, No. 2, pp. 269–271, Feb., 1988, C. Adachi, et al., "Electroluminescence in Organic Films With Three–Layer Structure".

Applied Physics Letter, vol. 63, No. 5, pp. 594–595, Aug. 2, 1993, T. Nakayama, et al., "Organic Photo and Electroluminescent Devices With Double Mirrors".

Burland et al paper of Chemical Review, 1994, vol. 94, No. 1 p. 48.

Nakayama et al. Applied Physics Lett. 63(5), Aug. 2, 1993, pp. 594–595.

H. Hasebe et al. J. Applied Physics vol. 33 (1994) pp. 6245–6248.

Naoya Ogata, Mol. Cryst. Liq. Cryst. 1994, vol. 254, pp. 75–85.

*Primary Examiner*—Kevin A. Kriess
*Assistant Examiner*—Lawrence O. Richardson
*Attorney, Agent, or Firm*—Antonelli, Terry, Stout & Kraus

[57] ABSTRACT

A resonance type variable wavelength luminescent device which can control a spectrum of emission light of luminescent elements in response to an input signal such as voltage, heat, pressure, sound wave, magnetic field, electric field, gravity, electromagnetic wave or the like. Sequentially formed as laminated on a glass substrate are a semi-transparent reflective film, first electrically conductive transparent electrode films, a variable optical length layer, second electrically conductive transparent electrode films, a hole injection layer, an active layer made of aluminum chelate or the like and metallic electrodes, so that the first and second electrically conductive transparent electrode films are mutually arranged in a matrix form. A voltage is applied between the second electrically conductive transparent electrode films and the metallic electrodes to cause light emission of the active layer, whereas a voltage is applied between the first and second electrically conductive transparent electrode films to control the optical length of the variable optical length layer and to control a spectrum of emission light of the device. The variable wavelength luminescent device can be applied to planar color displays, optical switches and various sorts of sensors.

19 Claims, 11 Drawing Sheets

F I G. 16
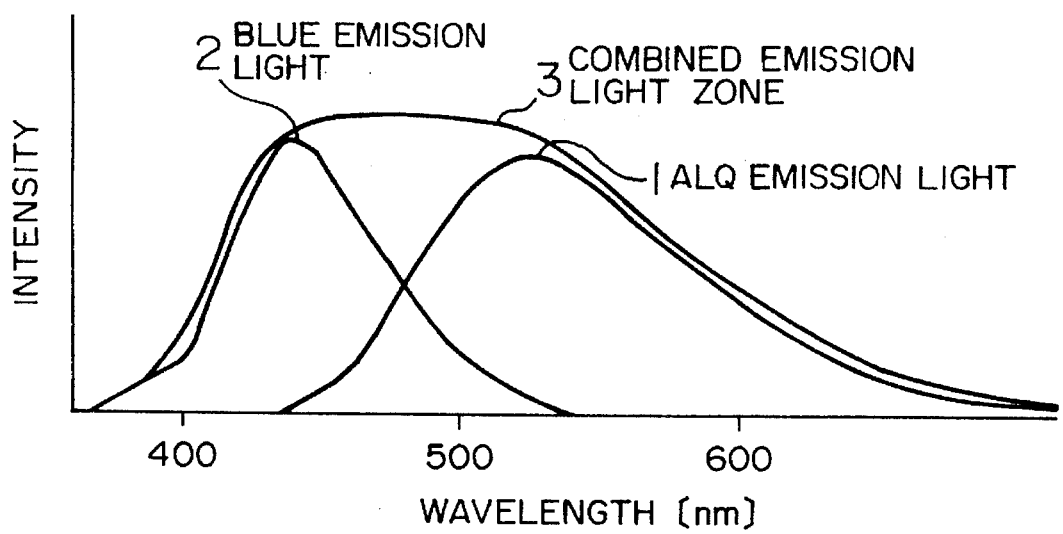
F I G. 17
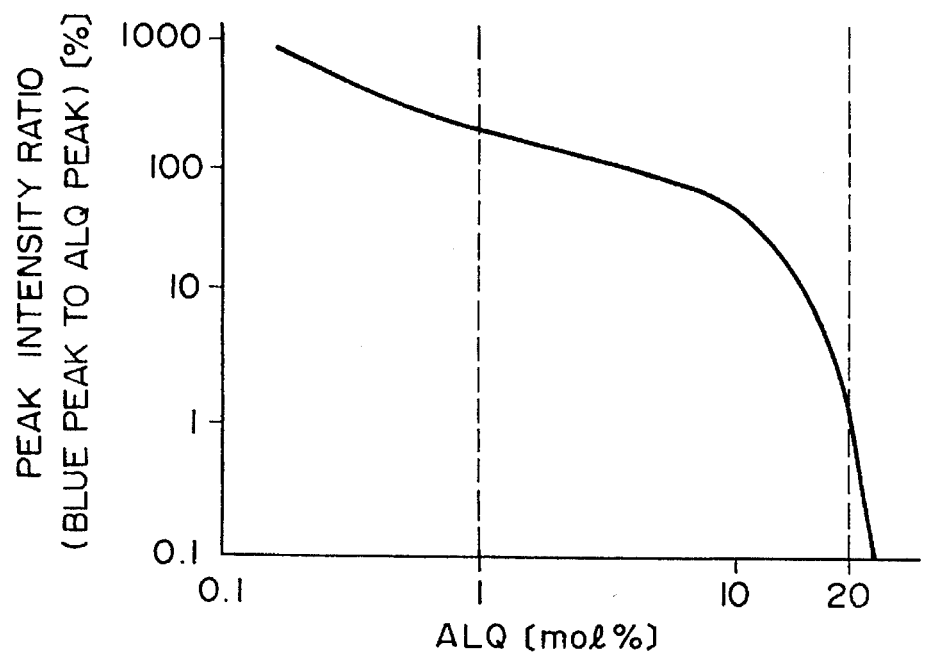

5,559,400

VARIABLE WAVELENGTH LUMINESCENT DEVICE AND CONTROL METHOD THEREFOR

BACKGROUND OF THE INVENTION

The present invention relates to a luminescent device and more particularly, to an electroluminescence (which will be referred to merely as EL, hereinafter) device which light wavelength is variable and which can be suitably used for optical logical devices, display devices, communication luminescent devices, read/write heads for information files, printers, sensors, etc. in information communication fields.

There is disclosed in a journal entitled "Japanese Journal of Applied Physics", vol. 27, No. 2 (1988), pp., L269–L271 that an emission spectrum is obtained based on a molecular formula for respective organic phosphor materials of a thin film.

FIG. 2 is a cross-sectional view of an ordinary organic luminescent device which uses the aforementioned thin film of the organic phosphor materials. The organic luminescent device comprises a glass substrate 101, electrically conductive transparent electrode films 103 formed on the glass substrate 101, a hole injection layer 104 made of diamine derivative (abbreviated to TAD), an active layer 105, metallic electrodes 106, these layers being sequentially formed in this order.

The electrically conductive transparent electrode films 103 and metallic electrodes 106 are arranged to be orthogonal to each other, in a matrix form. When a D.C. voltage of 5–20 V is applied to the matrix with the electrically conductive transparent electrode films 103 as a plus terminal and the metallic electrodes 106 as a minus terminal, an intersection part between the plus film and minus electrode emits light that exits from the glass substrate 101. The light emission part is called a pixel. The emission spectrum of the matrix is determined by the type of the luminescent material. When aluminum chelate (abbreviated to ALQ) is employed as the luminescent material, such a broad emission spectrum as shown in FIG. 3 is obtained. In this case, the emission spectrum has been determined essentially uniquely. Further, when it is desired to modify the emission spectrum, it has been common practice to dope a color filter but been impossible to freely modify the emission spectrum of a once-prepared device.

Also disclosed in a magazine entitled "Appl. Phys. lett.", Vol. 63(5), No. 2, August 1993 is such a matrix that, as shown in FIG. 8 (in the present application), comprises mirror electrodes of organic thin films formed for the metallic electrodes 106 in FIG. 2, a semi-transparent reflective film (half mirror) 102 formed on a glass substrate 101 to have a multi-layered structure of $TiO_2$ and $S_iO_2$ films, electrically conductive transparent electrode films 103 formed on the semi-transparent reflective film 102, a hole injection layer 104 of diamine derivative (TAD) formed on the electrically conductive transparent electrode films 103, an active layer 105 of aluminum chelate (ALQ) formed on the hole injection layer 104, metallic electrodes 106 formed on the active layer 105, these films and layers being formed in this order, so that the emission intensity of the organic thin films is increased based on the cavity effect to light between the metallic electrodes 106 and semi-transparent reflective film 102 and at the same time, the emission spectrum of the matrix is made narrow.

In other words, the above citation reports that, when a distance between the metallic electrodes 106 and semi-transparent reflective film 102 is set to correspond to a specific wavelength in the emission spectrum range (between 450 nm and 700 nm) of the active layer 105, light having the specific wavelength is resonated to increase the intensity of the light as shown in FIG. 9.

There is disclosed in U.S. Pat. No. 5,003,221 a liquid crystal device which comprises liquid crystal elements made up of a transparent substrate 11, stripe electrodes 13, a dielectric layer 14, an EL layer 15, a dielectric layer 16, stripe electrodes 17 formed sequentially on the transparent substrate 11, and a thin film layer 12 between liquid crystal elements, wherein the diffraction index of the thin film layer 12 is set so that a difference in the diffraction index between the transparent substrate 11 and liquid crystal elements becomes a minimum, thus reducing reflection of light coming from the outside to the liquid crystal device.

However, in the above prior art, it has been not possible to change the wavelength of the emission spectrum of the luminescent device.

Meanwhile, JP-A-3-197923 discloses a liquid crystal device in which at least two liquid crystal layers having a birefringence index varied by a voltage are provided between an analyzer and a polarizer and the birefringence is controlled by the voltage between liquid crystal electrodes to utilize the multiple liquid crystal layers as a variable color filter. However, this liquid crystal device becomes large in size when compared with the aforementioned thin film EL device, because a light source is required to be provided outside of the liquid crystal device.

The above prior art has had a problem that since the color of light issued from the luminescent device is determined uniquely by the used luminescent material, the color of the emitted light cannot be controlled.

That is, in the method disclosed in the above magazine "Appl. Phys. lett.", it is disadvantageously impossible to control the emission spectrum by an input signal.

The above JP-A-3-197923 has had problems that since the multi-layered variable color filter, the light transmission loss is large and that since a light source must be provided outside of the liquid crystal elements, the overall device becomes large in size.

SUMMARY OF THE INVENTION

It is an object of the present invention to provide a variable wavelength, compact luminescent device which can, in principle, avoid the light transmission loss of the aforementioned color filter or the like.

In order to solve the above problems, the concept of the present invention is based on the feature that the optical length of an active layer, provided between two light reflective layers at upper and lower sides of the active layer, is adjusted by an input signal to control the spectrum of output light of a variable wavelength luminescent device.

In accordance with an aspect of the present invention, there is provided a variable wavelength luminescent device wherein at least a semi-transparent reflective film, as one of the light reflective layers, first electrically conductive transparent electrode films, a variable optical length layer, second electrically conductive transparent electrode films, an organic thin film as the active layer and metallic electrodes, as the other of the light reflective layers, are sequentially laminated on a transparent substrate, and an input signal is applied between the first and second electrically conductive transparent electrode films to change the optical length between the films.

The present invention may include various modifications which include the following.

The variable optical length layer may be made of material whose refractive index or thickness is varied by a voltage, such as, e.g., polymer dispersion type liquid crystal material.

The variable optical length layer may be made of material whose thickness is varied in response to the input signal indicative of heat, pressure, sound wave, magnetic field, electric field, gravity or electromagnetic wave.

In this case, a flexible protective layer is provided on the transparent substrate and/or metallic electrodes so that the thickness of the variable optical length layer is varied in response to an external mechanical force applied onto the transparent substrate and/or metallic electrodes.

Further, a magnetized magnetic layer is provided at least one side of the flexible protective layer provided on the transparent substrate and/or metallic electrodes so that the thickness of the variable optical length layer is varied in response to application of an external magnetic field.

The variable optical length layer may be made of material whose thickness is varied when subjected to light irradiation.

The organic thin film may be made of material which corresponds to luminescent material having a luminous peak in a blue wavelength range (between 400 and 480 nm) and doped with 1%–20% of aluminum chelate.

The first and second electrically conductive transparent electrode films and the metallic electrodes are arranged in the form of a stripe form intersected with each other and intersection parts of the stripe form pixels.

The first and second electrically conductive transparent electrode films are arranged in the form of a stripe form parallel to each other and the metallic electrodes are arranged in the form of a stripe form intersected with the first and second electrically conductive transparent electrode films.

The width of the stripes of the first electrically conductive transparent electrode films is set to be less than half the width of the stripes of the second electrically conductive transparent electrode films.

Voltages for allowing passage of red, green and blue emission light components are switchingly applied between the first and second electrically conductive transparent electrode films.

Further, voltages for allowing passage of red, green and blue emission light components are sequentially applied between the first and second electrically conductive transparent electrode films.

The display side surface of the first and second electrically conductive transparent electrode films is divided into two, to one of which a voltage for causing light passage of the upper or lower half of a visible wavelength range is applied and to the other of which a voltage for causing light passage of the lower or upper half of the visible wavelength range.

The brief operation of the arrangement of the present invention is as follows.

The two light reflective layers provided at the both side surfaces of the active layer cause resonance of light of the active layer and the resonance optical length is controlled to control the spectrum of output emission light.

The transparent reflective films and metallic electrodes correspond to the above two reflective layers and the input signal applied between the first and second electrically conductive transparent electrode films is used to control the above resonance optical length.

The variable optical length layer made of, e.g., polymer dispersion type liquid crystal material is varied in its thickness when subjected to a voltage to change the resonance optical length.

The material varied in its thickness when subjected heat, pressure, sound wave, magnetic field, electric field, gravity, electromagnetic wave or the like acts to change the above optical length in response to these input signals.

Further, the flexible protective layer acts to protect the luminescent device and to transmit an external mechanical force to the variable optical length layer.

The magnetized magnetic layer acts to transmit an external magnetic field force to the variable optical length layer.

Material varied in its thickness when subjected to the above light irradiation acts to change the above variable optical length layer in response to the external light irradiation.

The luminescent material made of a mixture of luminescent material having a luminous light peak and 1%–20% of aluminum chelate doped thereto offers an organic thin luminous film which can control all the visible light range.

Further, in the case of the first and second electrically conductive transparent electrode films and metallic electrodes in a stripe form intersected with each other, the intersection parts of the stripes are selectively used as pixels.

When the first and second electrically conductive transparent electrode films are arranged parallel to each other in a stripe form, the intersection parts of the stripes of the metallic electrodes and first and second electrically conductive transparent electrode films are used as pixels.

When the width of the stripes of the first electrically conductive transparent electrode films is set to be less than half the width of stripes of the second electrically conductive transparent electrode films, two or more pixels are disposed within the width of each of stripes of the first electrically conductive transparent electrode films.

When voltages for causing passage of red, green and blue emission light components are applied between the first and second electrically conductive transparent electrode films, red, green and blue light can be switchingly emitted from the same pixel.

When voltages for causing passage of red, green and blue emission light components are sequentially applied between the first and second electrically conductive transparent electrode films, the positions of the red, green and blue pixels are fixed.

In the case where the first and second electrically conductive transparent electrode films are divided into two, to one of which a voltage for causing passage of light in a longer or shorter wavelength range of the visible wavelength zone is applied and to the other of which a voltage for causing passage of light in the shorter or longer wavelength range of the visible wavelength zone is applied, since the pixels, two of which make a set, cover the entire visible wavelength zone, the control range of the optical length of the organic thin active layer is reduced to half.

BRIEF DESCRIPTION OF THE DRAWINGS

Other objects, features and advantages of the invention will become apparent from the description of the following embodiments of the invention in conjunction with the accompanying drawings, in which:

FIG. 16 is an emission spectrum diagram of the variable wavelength luminescent device of FIG. 1 when blue luminescent material is doped to the variable optical length layer for emission of a full range of visible light;

FIG. 17 is a characteristic diagram showing a relationship between an addition rate of the above ALQ and a ratio of blue peak intensity to ALQ peak in FIG. 16;

DESCRIPTION OF THE PREFERRED EMBODIMENTS

Embodiment 1

Figure 1:
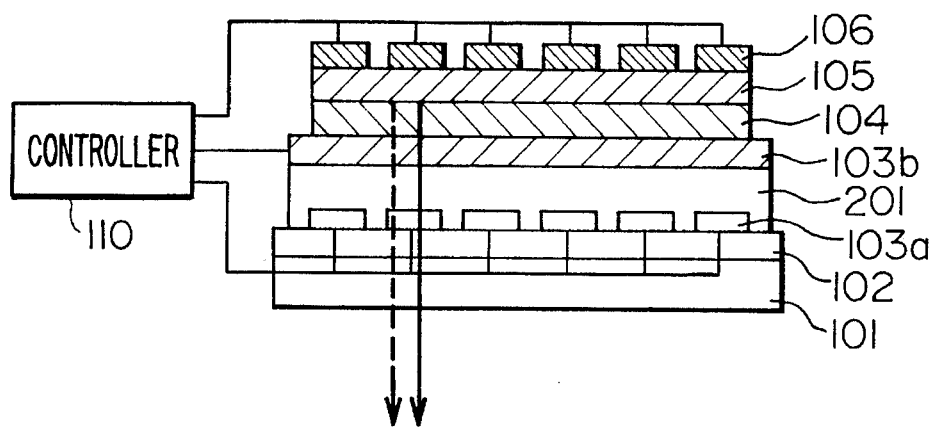
FIG. 1 is a cross-sectional view of a variable wavelength luminescent device in accordance with an embodiment of the present invention.
Figure 2:
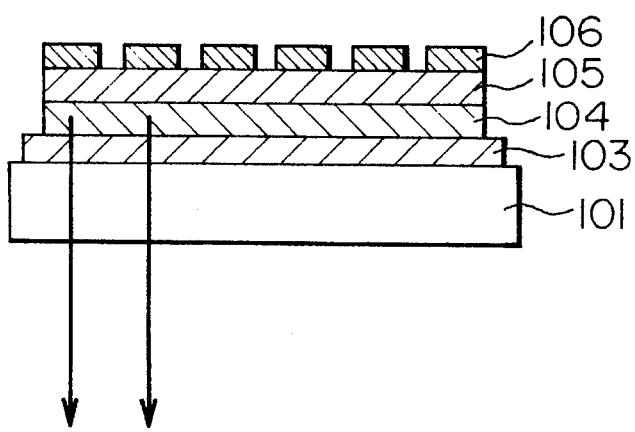
FIG. 2 is a cross-sectional view of a prior art luminescent device.

Referring to FIG. 1, there is shown a cross-sectional view of a variable wavelength luminescent device in accordance with a first embodiment of the present invention. In the illustrated example, sequentially formed on a glass substrate 101 are a semitransparent reflective film 102 of $TiO_2$ and $SiO_2$ layers, electrically conductive transparent electrode films 103a made of indium tin oxide (ITO), a variable optical length layer 201 made of polymer dispersion type liquid crystal, electrically conductive transparent electrode films 103b made of indium tin oxide (ITO), a hole injection layer 104 made of diamine derivative (TAD), an active layer 105 made of aluminum chelate (ALQ), and a metallic electrodes 106 made of Ag:Mg.

Figure 4:
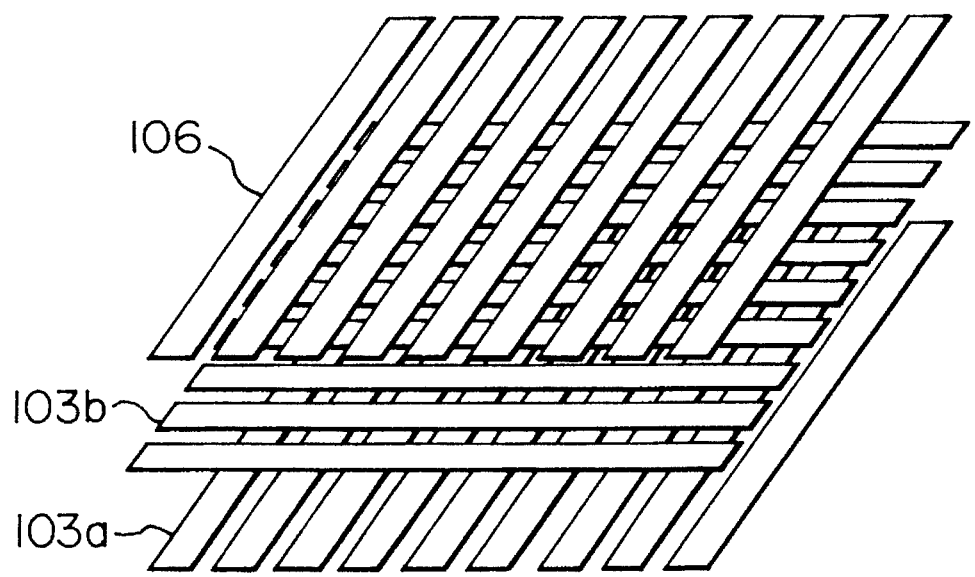
FIG. 4 is a perspective view of an example of array of matrix electrodes in FIG. 1.

As shown in FIG. 4, the electrically conductive transparent electrode films 103b and metallic electrodes 106 are arranged to be perpendicular to each other in the form of a matrix, and a D.C. voltage of 5–20 V is applied to the electrically conductive transparent electrode films 103b at its plus terminal and metallic electrodes 106 at its minus terminal, so that intersections between both films and the electrodes are to be light-emitted as pixels. When the electrically conductive transparent electrode films 103a and 103b are also arranged to be perpendicular to each other, the spectra of emission light of the respective pixels can be controlled on every pixel basis by a voltage applied by a controller 110 between the electrically conductive transparent electrode films 103a and 103b.

Figure 5:
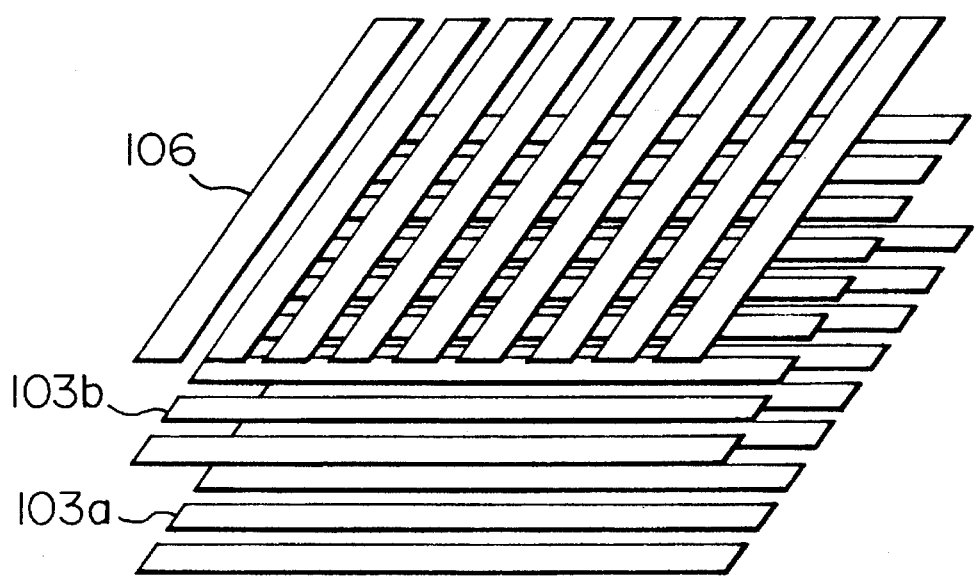
FIG. 5 is a perspective view of another example of array of matrix electrodes in FIG. 1.

When the electrically conductive transparent electrode films 103a and 103b are arranged in the form of stripes parallel to each other as shown in FIG. 5, the output light spectra of the pixels can be collectively controlled by a voltage applied between the electrically conductive transparent electrode films 103a and 103b.

Figure 6:
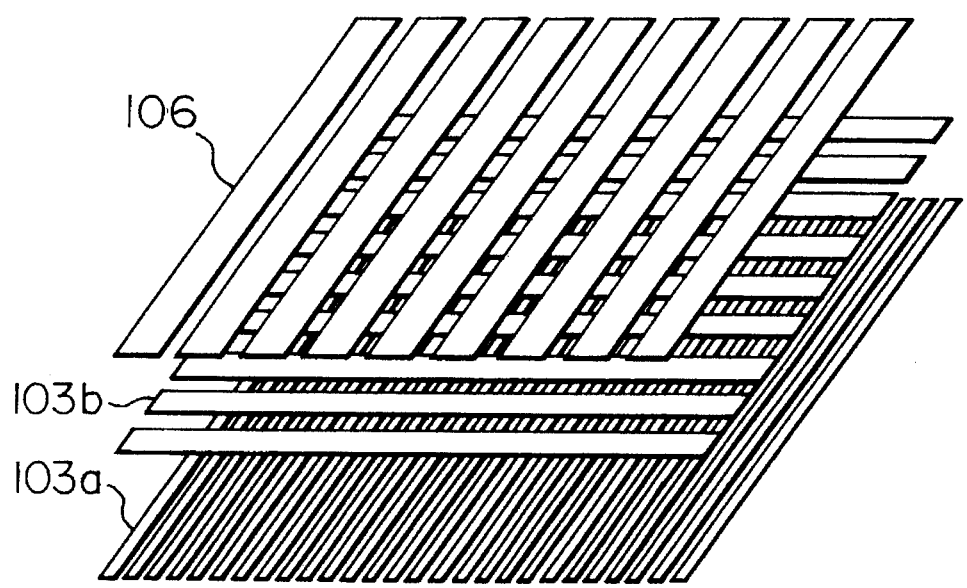
FIG. 6 is a perspective view of a further example of array of matrix electrodes in FIG. 1.
Figure 7:
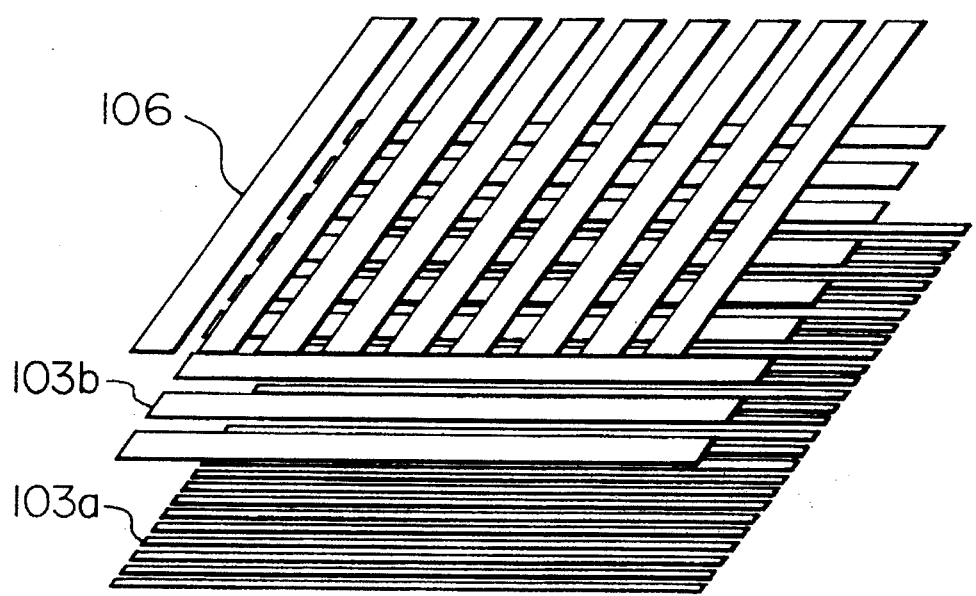
FIG. 7 is a perspective view of yet another example of array of matrix electrodes in FIG. 1.
Figure 8:
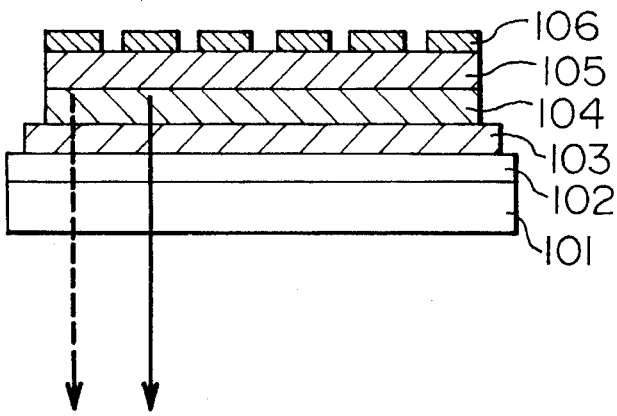
FIG. 8 is a cross-sectional view of a prior art resonance type luminescent device.
Figure 9:
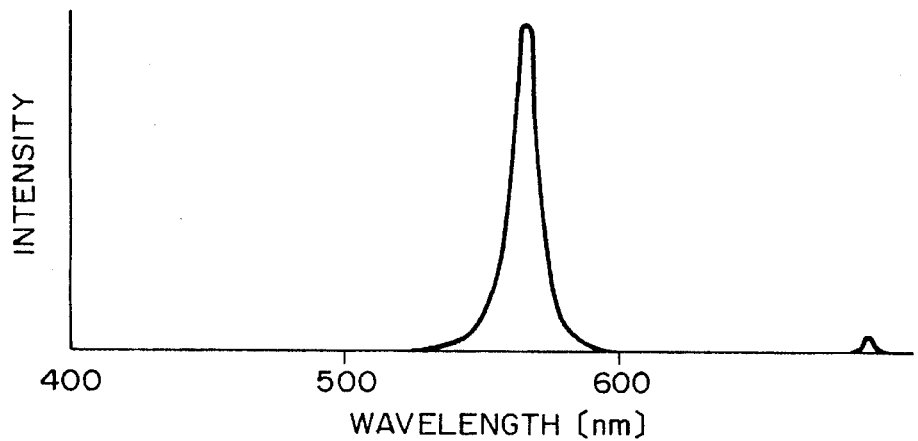
FIG. 9 is a emission spectrum diagram of the device of FIG. 8.

When a spacing between the adjacent electrically conductive transparent electrode films 103a in FIG. 4 or 5 is set to be half that of the electrically conductive transparent electrode films 103b or less as shown in FIGS. 6 and 7, each of the pixels formed by the metallic electrodes 106 and electrically conductive transparent electrode films 103b can issue light corresponding to a combination of a plurality of luminous color light.

Figure 3:
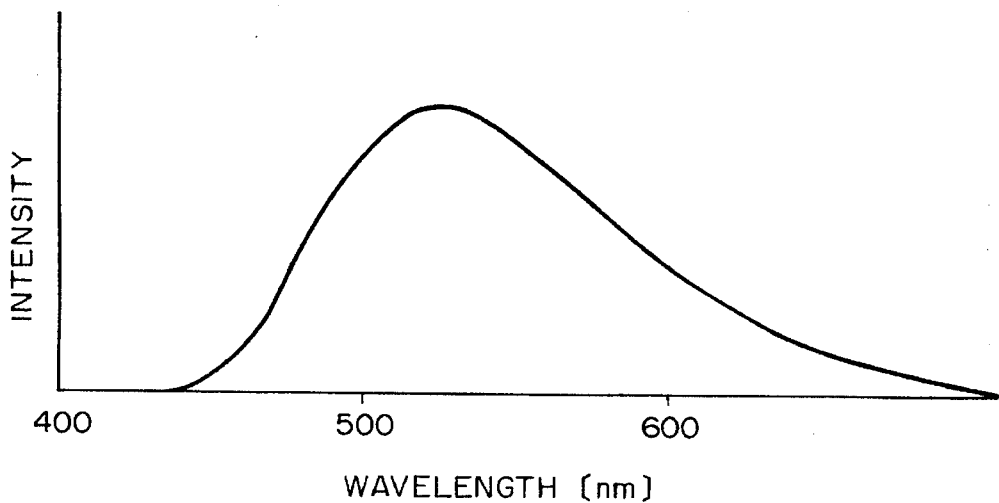
FIG. 3 is an emission spectrum diagram of the device of FIG. 2.

A sum d of optical lengths, obtained by products of the respective thicknesses and refractive indexes of the electrically conductive transparent electrode films 103a and 103b, hole injection layer 104, active layer 105 and variable optical length layer 201, is set to have a value in an ALQ emission spectrum range (between 450 and 700nm) in the absence of the semi-transparent reflective film 102 in FIG. 3.

The present embodiment is arranged so that a voltage applied between the electrically conductive transparent electrode films 103a and 103b causes the refractive index of the variable optical length layer 201 to be varied within a range of 1.5–1.8, whereby the value of the optical length sum d is equal to the length of a resonator and thus light is varied by 200 nm in both-way travel on the resonator length. To this end, the variable optical length layer 201 is set to have a thickness of 340 nm.

Figure 10:
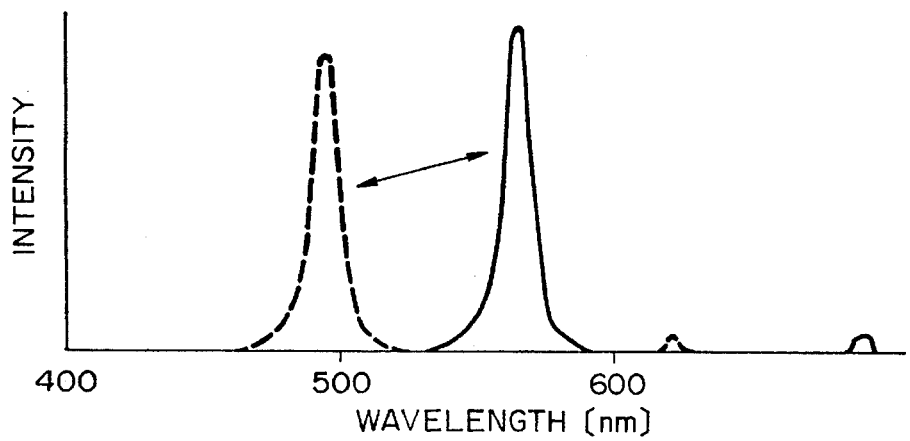
FIG. 10 is an emission spectrum diagram of the device of FIG. 1.

More specifically, the optical length between the metallic electrodes 106 and semi-transparent reflective film 102 is controlled, in accordance with the application voltage between the electrically conductive transparent electrode films 103a and 103b, to resonate light having a wavelength corresponding to the controlled optical length, so that the light emission intensity of the emission spectrum is increased and at the same time, the width of the emission spectrum is narrowed. As a result, a specific light component of a specific wavelength in the emission spectrum range (between 450–700 nm) of the active layer 105 is arbitrarily extracted to be increased in its intensity, as shown in FIG. 10.

Embodiment 2

Figure 11:
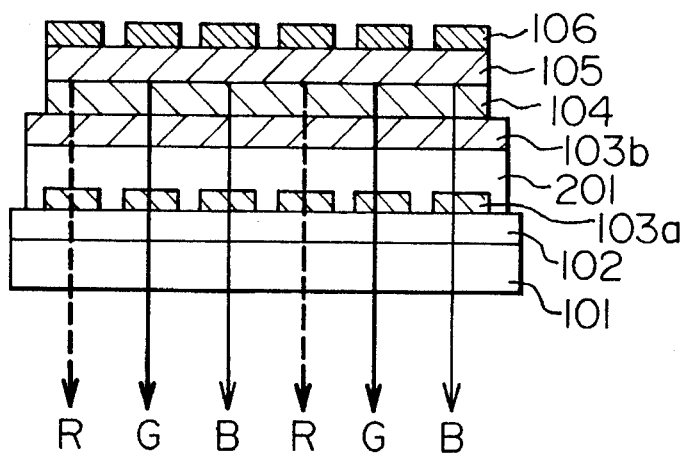
FIG. 11 is a cross-sectional view of the variable wavelength luminescent device of the present invention when used as a three-primary-color display.

Shown in FIG. 11 is a cross-sectional view of a variable wavelength luminescent device in accordance with a second embodiment of the present invention when the device of FIG. 1 is used as a three-primary-color display. More in detail, in the present embodiment, voltages corresponding to three-primary-colors of red (R), green (G) and blue (B) are sequentially applied between the uniformly-prepared electrically conductive transparent electrode films 103a and 103b of the respective pixels to emit light of 3 primary colors of the three pixels, and the intensity of emission light of each pixel is controlled by a voltage applied between the electrically conductive transparent electrode films 103b and metallic electrodes 106. As a result, since the respective intensities of emission light components of the colors R, G and B can be further controlled mutually independently, a color light emission display based on the 3 primary colors can be realized.

Embodiment 3

Figure 12:
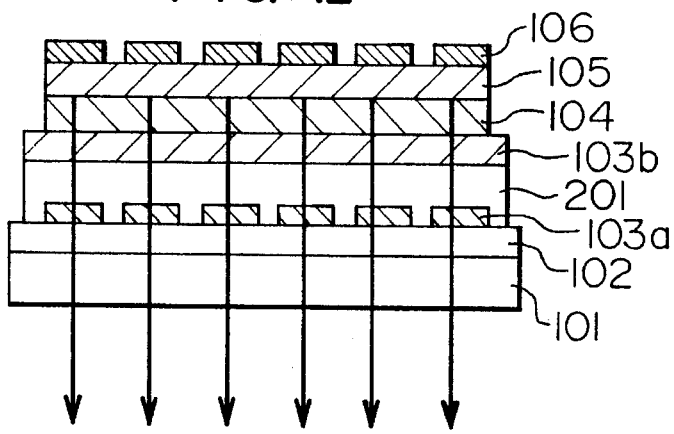
FIG. 12 is a cross-sectional view of the variable wavelength luminescent device of the present invention when the respective pixels of the device are light emitted in full color.

Referring to FIG. 12, there is shown a variable wavelength luminescent device in accordance with a third embodiment of the present invention, in which voltages corresponding to predetermined color shades are continually applied between the electrically conductive transparent electrode films 103a and 103b to allow the respective pixels to also emit light of medium shades. As in the example of FIG. 11, the intensity of emission light of the respective pixels is controlled by a voltage applied between the electrically conductive transparent electrode films 103b and metallic electrodes 106. In FIG. 11, a set of 3 pixels function as a single full-color pixel; whereas in the present embodiment, each of the pixels functions as a full-color pixel, which results in that its display density and effective light emission area can be made substantially triple and the device can be used for a display unit of a computer terminal.

Embodiment 4

Figure 13:
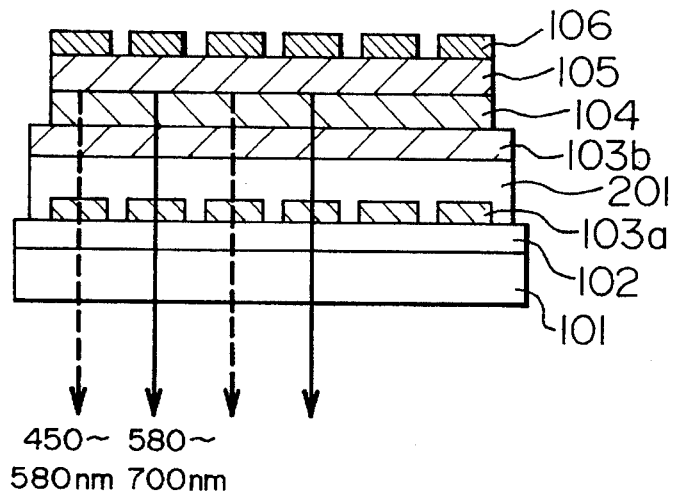
FIG. 13 is a cross-sectional view of the variable wavelength luminescent device when two full-color wavelength ranges are assigned to the respective pixels of the device.

FIG. 13 is a variable wavelength luminescent device in accordance with a fourth embodiment of the present invention, in which a range of all the wavelengths of full-color emission light is divided into a plurality of sub-ranges and the divided sub-ranges of the emission light wavelengths are assigned to divided pixel groups. As a result, since the respective wavelength control ranges of the pixel groups can be made narrow, the corresponding thickness of the variable optical length layer 201 can be also made narrow and thus the thickness design margin of the display device can be set to be large. When the thickness of the variable optical length layer 201 is large, unnecessary emission light peaks other than main emission light peaks tend to easily occur and thus the light color impurity is disadvantageously deteriorated or reduced. However, the present embodiment can solve this problem.

In the embodiment of FIG. 13, the wavelength range of full-color emission light is divided into two of a longer wavelength sub-range (between 580 and 700 nm) and a shorter wavelength sub-range (between 450 and 580 nm) and voltages corresponding to the divided longer and shorter wavelength sub-ranges are alternately applied on every pixel basis. Since the emission light wavelength range of each pixel is divided into ½, the respectively optimized pixel structure can be realized.

Embodiment 5

Figure 14:
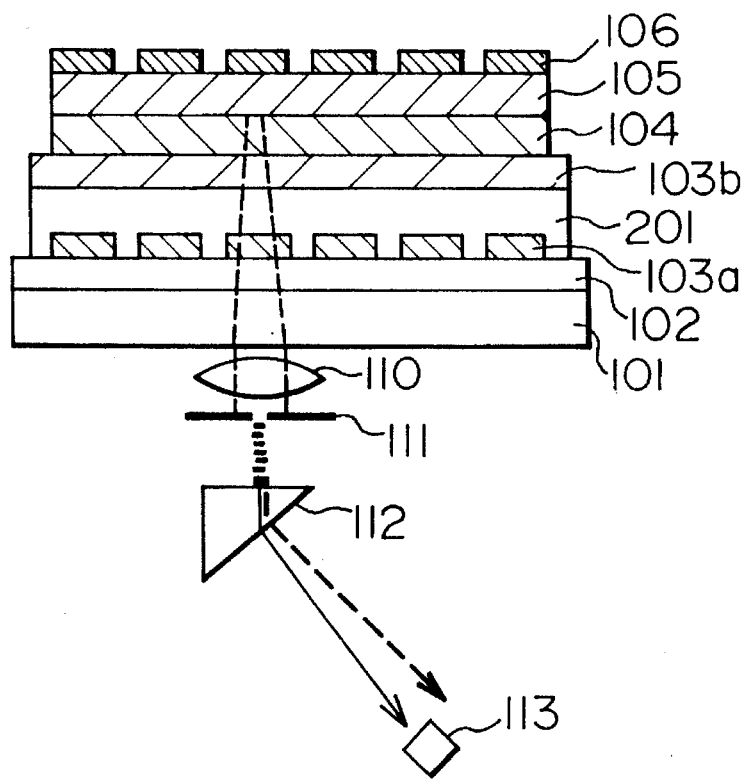
FIG. 14 is a cross-sectional view of the variable wavelength luminescent device when the device is used as an optical switch.

FIG. 14 is a cross-sectional view of a variable wavelength luminescent device in accordance with a fifth embodiment of the present invention when used an optical switch.

In the variable wavelength luminescent device of the embodiment of FIG. 14, since a voltage applied between the electrically conductive transparent electrode films 103a and 103b causes variation of the wavelength of emission light, a lens 110, a prism 112 and so on are provided at the light emission side of the device to deflect the light path of the emission light according to the wavelength of the emission light and to detect the emission light having a predetermined deflection angle by an optical detector 113. In this case, it is unnecessary to set the variation range of the optical length d by the variable optical length layer 201 to be as large as that of the aforementioned color display, the variable optical length layer 201 can be made of such nonlinear optical material having a fast response speed or time as lithium niobate.

As a result, there can be obtained such an optical device as to be switched by the voltage applied between the electrically conductive transparent electrode films 103a and 103b.

Further, when a voltage applied to the hole injection layer 104 and a voltage applied to the variable optical length layer 201 are used as logical inputs, for example, such logical operation as AND, OR or the like can be optically carried out. Furthermore, when the structures of the metallic electrodes 106 and electrically conductive transparent electrode films 103a and 103b are suitably modified, there can be realized a more complicated optical logical circuit.

Embodiment 6

Figure 15:
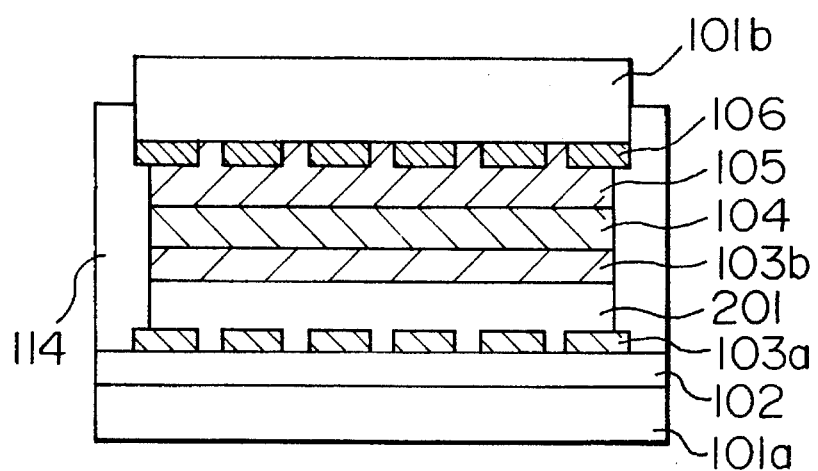
FIG. 15 is a cross-sectional view of the variable wavelength luminescent device of the present invention when a variable optical length layer in the device is made of non-solid material.

Shown in FIG. 15 is a cross-sectional view of a variable wavelength luminescent device in accordance with a sixth embodiment of the present invention when the variable optical length layer 201 is made of nonsolid, variable optical length material. More specifically, a semi-transparent reflective film 102 and electrically conductive transparent electrode films 103a and 103b are sequentially formed on a glass substrate 101a. More specifically, such variable optical length material 201 as, e.g., polymer dispersion type liquid crystal material, is sealed within a space defined between the electrically conductive transparent electrode films 103a and 103b. Next, sequentially formed on the electrically conductive transparent electrode films 103b are a hole injection layer 104, an active layer 105 and a metallic electrodes 106. The entire variable wavelength luminescent device is fixed by a sealing member 114 and sealed by the two substrates 101a and 101b, so that the variable optical length layer 201 has a predetermined thickness.

Embodiment 7

Although the active layer 105 has been made of ALQ material providing a high and stable luminance or brightness in the foregoing embodiments of the present invention, the blue color component becomes, in some applications, insufficient because the lower limit of wavelength of the blue emission light is 450 nm.

This problem can be solved by dopeing to the ALQ material such material having an emission light peak in a blue zone of 400–480 nm as azomethene zinc complex. FIG. 16 shows a seventh embodiment of the variable wavelength luminescent device in accordance with the present invention, in which case such an emission light zone (shown by reference numeral 3) as broad as substantially 400–700 nm is obtained by adding the an ALQ emission light zone 1 to the above blue zone 2.

FIG. 17 is a graph showing a relationship between an addition rate of the above ALQ and a ratio of blue peak intensity to ALQ peak. The intensity of the blue emission light is sufficient to be about $1/10$ the intensity of the green emission light when the variable wavelength luminescent device is used for a display. Thus, ten times the blue emission light intensity is set to be $1/5$ times to 5 times the ALQ emission light intensity. To this end, the amount of ALQ addition is set to be 1–20 mol %.

Embodiments 8 and 9

Figure 18:
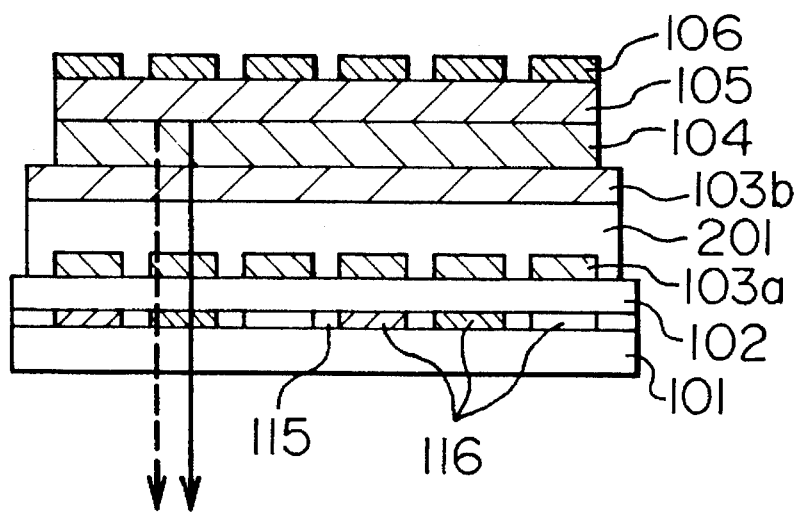
FIG. 18 is a cross-sectional view of a variable wavelength luminescent device when the device of FIG. 1 is attached with an improved-recognition filter including a black mask and color filters.
Figure 19:
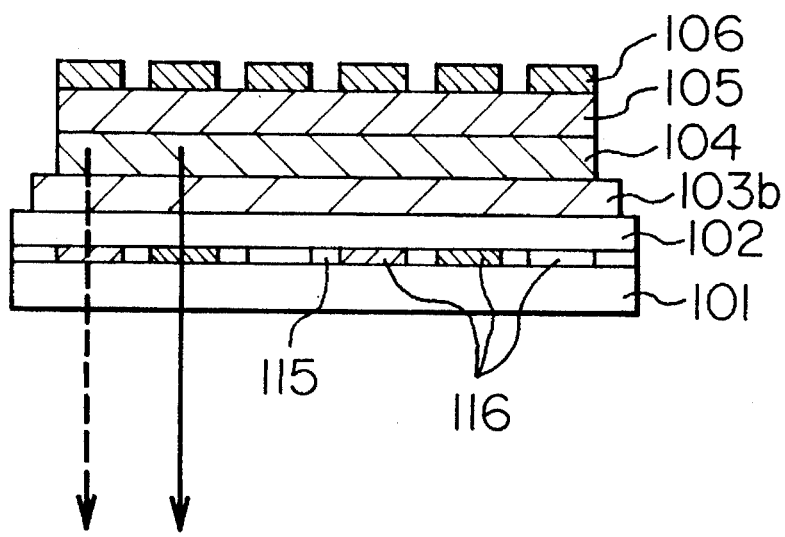
FIG. 19 is a cross-sectional view of a variable wavelength luminescent device when the device of FIG. 1 is attached with another improved-recognition filter including a black mask and color filters.

FIGS. 18 and 19 are cross-sectional views of variable wavelength luminescent devices in accordance with eighth and ninth embodiments of the present invention, in which a black mask 115 is provided at a light emission part and color filters 116 for allowing transmission of light belonging only to respective emission light zones or ranges are provided at the light emission parts of the respective pixels. More specifically, FIG. 18 is the embodiment in which the emission light of the respective pixels are controlled in the respective light transmission ranges of the color filters 116; while, FIG. 19 is the embodiment in which the electrically conductive transparent electrode films 103a are omitted and the spectrum of emission light is uniquely restricted by the color filters 116. In this connection, the black mask 115 and color filters 116 may be provided outside of the glass substrate 101 as necessary.

The variable optical length layer 201 may be applied to all luminescent devices having a fine optical resonator structure and the variable optical length member may be made of one selected from the group of various sorts of materials including organic and inorganic materials. However, when the variable optical length layer is made of organic luminescent material, the thickness of the variable optical length layer 201 can be easily set to be on the order of emission light wavelengths, which results in that the design and fabrication can be relatively facilitated and a good stability of long term can be obtained.

If necessary, the variable optical length layer 201 may be made of, in addition to the aforementioned material having a refractive index varied according to the voltage, such material as the thickness of the layer is varied according to such an input signal as heat, pressure, sound wave, light, magnetic field, electric field, gravity, electromagnetic wave and so on, with substantially the same or equivalent operation and effects. Further, these materials may also be employed in combination. In this case, the electrically conductive transparent electrode films (ITO) 103a may be omitted as necessary. Since the spectrum of such a luminescent device is varied according to such an input signal as heat, pressure, sound wave, magnetic field, electric field, gravity, electromagnetic wave or the like, the device can also be used as a device for detecting the heat, pressure, sound wave, magnetic field, electric field, gravity, electromagnetic wave or the like.

Embodiment 10

Figure 20A:
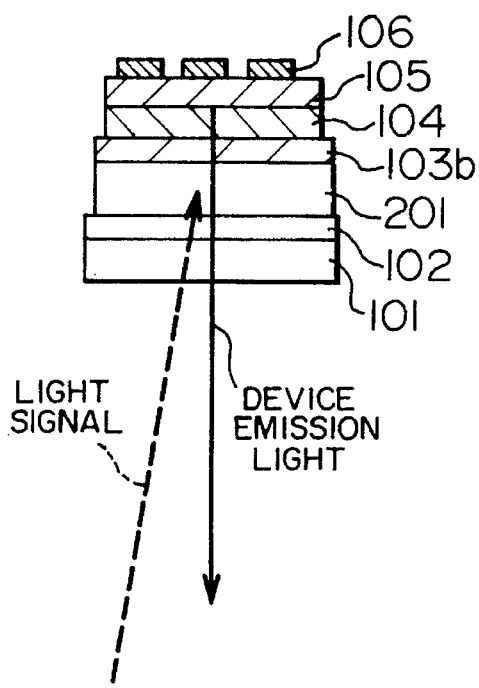
FIGS. 20A and 20B are cross-sectional views of the embodiment of the variable wavelength luminescent device of the present invention when output light of the device is controlled by external light signal.
Figure 20B:
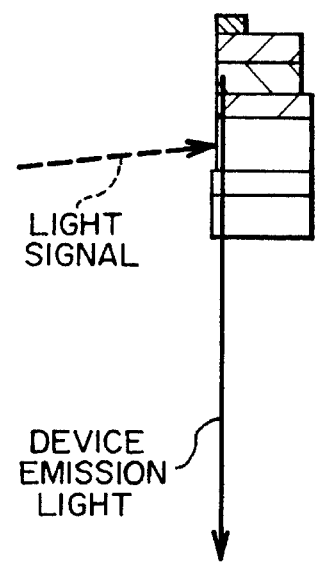

FIGS. 20A and 20B show a variable wavelength luminescent device in accordance with a tenth embodiment of the present invention in which the wavelength and intensity of emission light are controlled by light irradiation. The variable optical length layer 201 is made of nonlinear optical material whose optical length is varied by light irradiation. The above irradiation light (light signal) is irradiated from one side of the glass substrate 101 as shown in FIG. 20A or from one side of the variable optical length layer 201 as shown in FIG. 20B.

Figure 21:
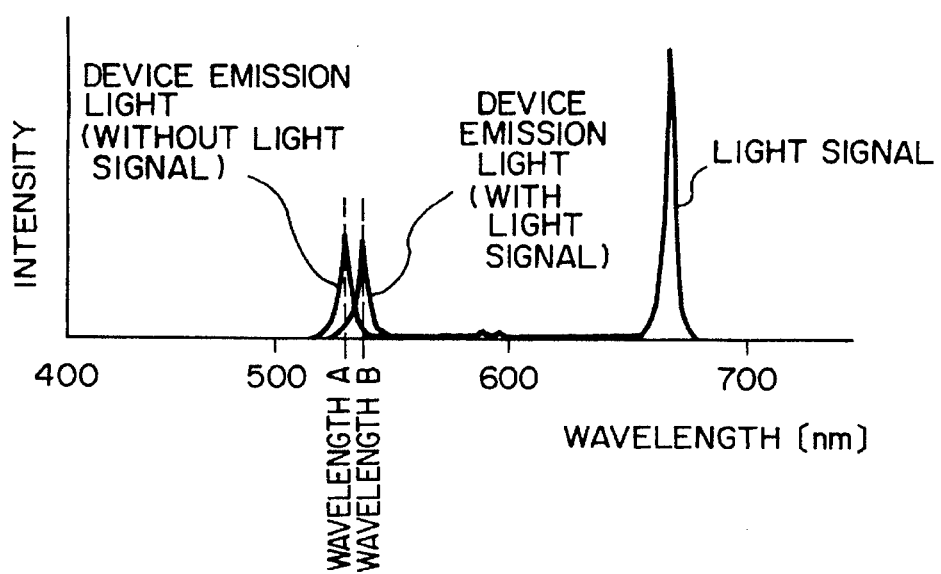
FIG. 21 is an output light spectrum control diagram in FIGS. 20A and 20B.
Figure 22:
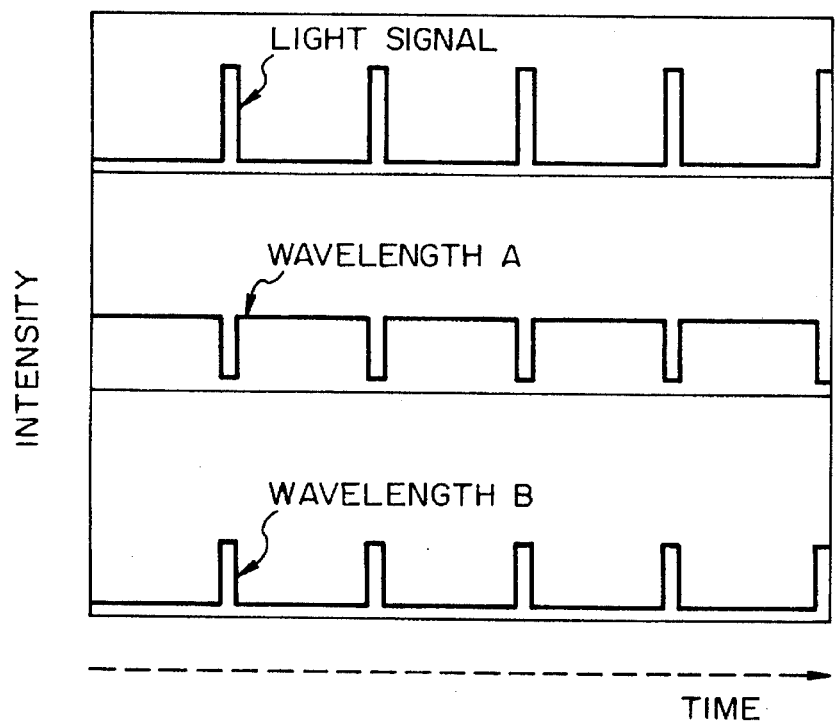
FIG. 22 is an output light intensity control diagram in FIGS. 20A and 20B.

Referring to FIG. 21, there is shown an emission spectrum diagram showing, as an example, a variation of emission light with respect to the above light signal. This diagram indicates that the emission light located at a position of wavelength A in the absence of the light signal is moved to a position of wavelength B in the presence of the irradiated light signal. Accordingly, since the irradiation of the light signal causes the decrease of intensity of the emission light of the wavelength A and the increase of intensity of the emission light of the wavelength B as shown in FIG. 22, the device of FIGS. 20A and 20B can be utilized as a light-to-light conversion device.

Embodiment 11

Figure 23:
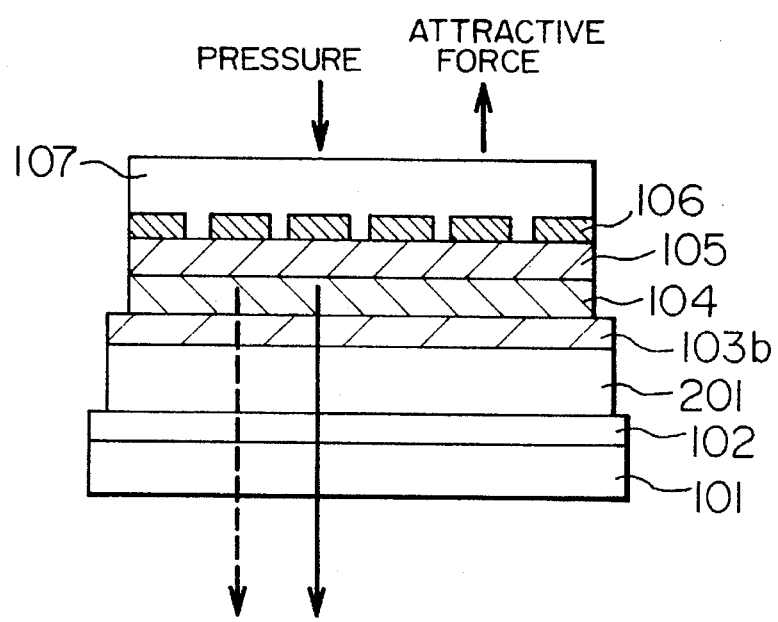
FIG. 23 is a cross-sectional view of the embodiment of the variable wavelength luminescent device of the invention when output light of the device is controlled by external force signal.

FIG. 23 is a cross-sectional view of a variable wavelength luminescent device in accordance with an eleventh embodiment of the present invention, in which such a mechanical force as pressure or attractive force is applied to a variable optical length layer 201 to vary its optical length. In this case, a flexible protective layer 107 made of such insulating material as plastic material is provided on metallic electrodes to protect the electrodes and at the same time, to prevent the transmission of an external force to the vicinity of pixels.

Figure 24:
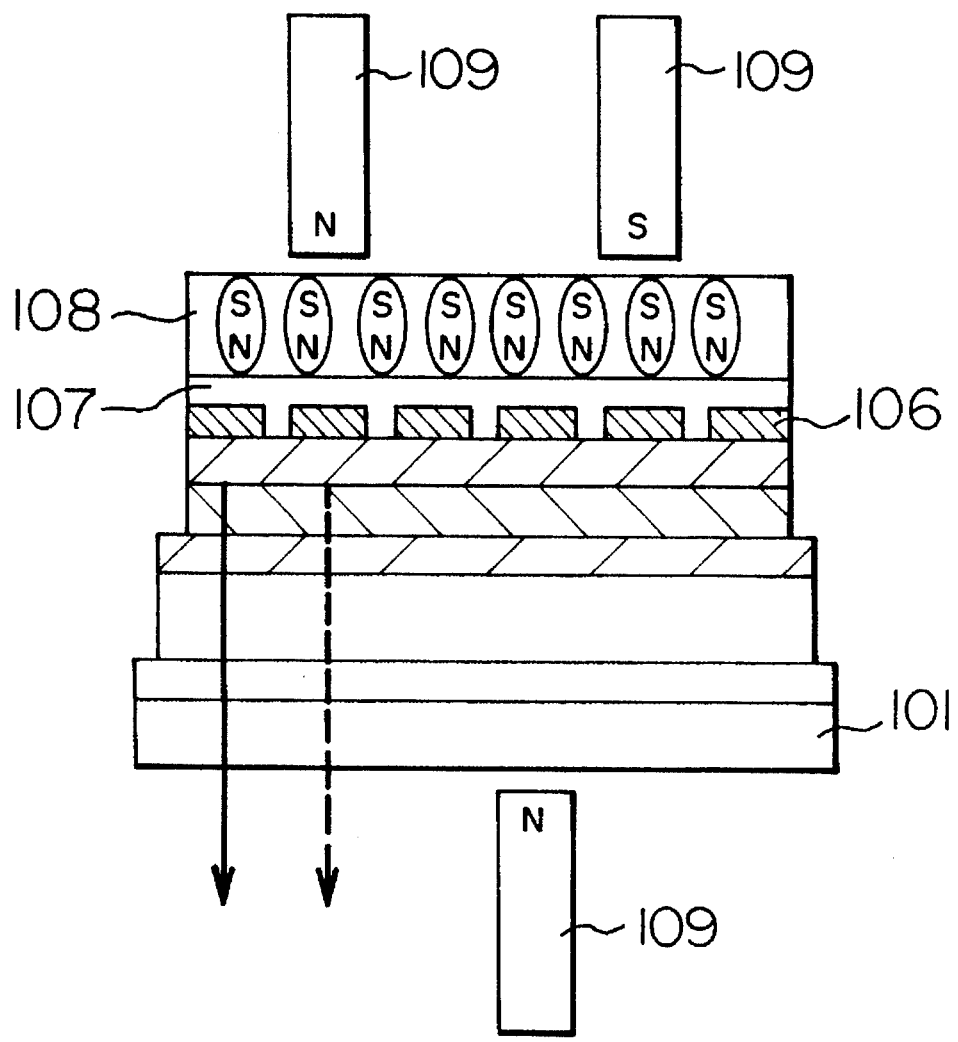
FIG. 24 is a cross-sectional view of the embodiment of the variable wavelength luminescent device of the invention when the external force signal in FIG. 23 is replaced by a magnetic force.

FIG. 24 is a specific example of the device of FIG. 23. Provided on the above flexible protective layer 107 is a vertically-magnetized fine film or a magnetic layer 108 including such simple magnetic material as iron or cobalt, so that when an external magnetic field 109 is applied to the device from its top side or from its lower side or from its both top and bottom sides, a pressure or attractive force caused by the magnetic field acts on the variable optical length layer 201 to vary its optical length.

When it is desired to act the external magnetic field 109 on the variable wavelength luminescent device from one side of the glass substrate 101, the glass substrate 101 is made of transparent, thin, flexible material and is provided on its metallic electrode side with a holder plate.

Although features obtained according to the foregoing embodiments of the present invention are given in the following, it goes without saying that the invention is not restricted only to these features. As has been described in the foregoing, in accordance with the present invention, there can be provided a variable wavelength luminescent device of a resonance type which can control the spectra of emission light of the device based on such an input signal as voltage, heat, pressure, sound wave, magnetic field, electric field, gravity, electromagnetic wave or the like.

Since the emission light color and intensity of each of pixels arranged in a matrix form can be controlled by the above voltage signal, there can be provided a luminescent device for a planar color display.

Further, when a combination of voltages applied between the electrodes arranged in the matrix form are used as inputs and variations in the resultant spectra of emission light are used as outputs, there can be provided a light-output, digital logical device.

Furthermore, when the output light spectrum of the resonance type luminescent elements is controlled by an external light signal, there can be provided a light-to-light conversion device.

In addition, when the output light spectrum, of the resonance type luminescent elements is controlled by such a mechanical force signal as a magnetic force, there can be provided a force-to-light conversion device.

What is claimed is:

1. A variable wavelength luminescent device comprising:
   an active layer;
   two light reflective layers provided on upper and lower sides of said active layer;
   signal application means for applying an input signal; and
   optical length control means for varying an optical length between said two light reflective layers in accordance with the input signal of said signal application means,
   wherein light of said active layer is resonated by said two light reflective layers and emission spectrum of output light is controlled by said input signal.

2. A variable wavelength luminescent device as set forth in claim 1, wherein at least a semi-transparent reflective film being one of said two light reflective layers, a first layer of transparent electrode films, a variable optical length layer, a second layer of transparent electrode films, an organic thin film forming an active layer and metallic electrodes being the other of said light reflective layers, are sequentially laminated on a transparent substrate;
   wherein said signal application means includes said first and second layers of electrically conductive transparent electrode films and said control means includes said variable optical length layer; and
   wherein the optical length of said variable optical length layer is varied in response to application of said input signal between said first and second layers of transparent electrode films.

3. A variable wavelength luminescent device as set forth in claim 2, wherein said variable optical length layer is made of material whose refractive index or thickness is varied by a voltage.

4. A variable wavelength luminescent device as set forth in claim 3, wherein said variable optical length layer is made of polymer dispersion type liquid crystal material.

5. A variable wavelength luminescent device as set forth in claim 2, wherein said variable optical length layer is made of material whose thickness is varied in response to said input signal indicative of at least one of a pressure signal, magnetic signal, and electrical signal.

6. A variable wavelength luminescent device as set forth in claim 5, further comprising a flexible protective layer provided on said transparent substrate and/or metallic electrodes to form said signal application means, and wherein a thickness of said variable optical length layer is varied in response to an external mechanical force applied onto said transparent substrate and/or metallic electrodes.

7. A variable wavelength luminescent device as set forth in claim 6, further comprising a magnetized magnetic layer provided at least one side of said flexible protective layer provided on said transparent substrate and/or metallic electrodes, and wherein a thickness of said variable optical length layer is varied in response to application of an external magnetic field.

8. A variable wavelength luminescent device as set forth in claim 2, wherein said variable optical length layer is made of material whose thickness is varied when subjected to light irradiation.

9. A variable wavelength luminescent device as set forth in claim 5, wherein first electrically conductive transparent electrode films are omitted.

10. A variable wavelength luminescent device as set forth in claim 2, wherein said organic thin films as said active layer is made of material which corresponds to luminescent material having a luminous peak in a blue color zone and doped with aluminum chelate.

11. A variable wavelength luminescent device as set forth in claim 2, wherein said organic thin film as said active layer is made of material which corresponds to luminescent material having a luminous peak in a range of 400–480 nm and doped with aluminum chelate.

12. A variable wavelength luminescent device as set forth in claim 10, wherein the amount of said aluminum chelate addition is 1–20 mol %.

13. A variable wavelength luminescent device as set forth in claim 2, wherein said first and second electrically conductive transparent electrode films and said metallic electrodes are arranged in the form of a stripe form intersected with each other and intersection parts of said stripe form pixels.

14. A variable wavelength luminescent device as set forth in claim 2, wherein said first and second electrically conductive transparent electrode films are arranged in the form of a stripe form parallel to each other and said metallic electrodes are arranged in the form of a stripe form intersected with said first and second electrically conductive transparent electrode films.

15. A variable wavelength luminescent device as set forth in claim 13, wherein a width of the stripes of said first electrically conductive transparent electrode films is set to be less than half a width of the stripes of said second electrically conductive transparent electrode films.

16. A method for controlling the variable wavelength luminescent device set forth in claim 2, comprising the steps of:
   applying a voltage between said first and second electrically conductive transparent electrode films;
   changing the optical length of said variable optical length layer; and
   causing an emission light component having a specific shade to be passed.

17. A method for controlling the variable wavelength luminescent device set forth in claim 2, comprising the steps of:
   applying a voltage between said first and second electrically conductive transparent electrode films;
   changing the optical length of said variable optical length layer; and
   causing an emission light component of red, green or blue to be passed.

18. A method for controlling the variable wavelength luminescent device set forth in claim 2, comprising the steps of:

previously dividing an emission light wavelength zone into a plurality of wavelength zones;

assigning said plurality of divided wavelength zones to different pixels;

applying a voltage between said first and second electrically conductive transparent electrode films;

changing the optical length of said variable optical length layer; and causing emission light components belonging to said divided wavelength zones to be passed.

19. A variable wavelength luminescent device as set forth in claim 2, wherein a color filter and/or a black mask is provided in a light emission side of said variable wavelength luminescent device to reduce surface reflection of external light.

* * * * *